United States Patent [19]
Ohashi et al.

[11] Patent Number: 5,981,394
[45] Date of Patent: Nov. 9, 1999

[54] CHEMICAL MECHANICAL POLISHING METHOD, POLISHER USED IN CHEMICAL MECHANICAL POLISHING AND METHOD OF MANUFACTURING SEMICONDUCTOR DEVICE

[75] Inventors: Hiroyuki Ohashi, Kamakura; Tuyoshi Kato, Mie-ken, both of Japan

[73] Assignee: Kabushiki Kaisha Toshiba, Kawasaki, Japan

[21] Appl. No.: 08/938,154

[22] Filed: Sep. 26, 1997

[30] Foreign Application Priority Data

Sep. 30, 1996 [JP] Japan .................................. 8-259512

[51] Int. Cl.$^6$ .................................................. H01L 21/00
[52] U.S. Cl. ............................. 438/692; 216/88; 216/89; 438/693; 156/345
[58] Field of Search ..................... 438/626, 631, 438/672, 692, 693, 647, 753, 756; 216/38, 88, 89, 91, 92, 99; 156/345 LP, 345 LC

[56] References Cited

U.S. PATENT DOCUMENTS

| | | | |
|---|---|---|---|
| 5,491,113 | 2/1996 | Murota | 438/692 X |
| 5,494,857 | 2/1996 | Cooperman et al. | 438/692 X |
| 5,688,720 | 11/1997 | Hayashi | 438/692 X |
| 5,880,003 | 3/1999 | Hayashi | 438/692 X |

*Primary Examiner*—William Powell
*Attorney, Agent, or Firm*—Finnegan, Henderson, Farabow, Garrett & Dunner, L.L.P.

[57] ABSTRACT

The present invention provides the chemical-mechanical polishing method having the step of subjecting a film to be polished, provided on a main surface of a substrate, and having a projection portion and a recess portion on a surface thereof, to polishing and etching, wherein the projection portion of the film to be polished is mechanically polished and chemically etched while covering the recess portion with a protective film to protect it from being chemically etched by supplying a protecting agent on the film to be polished.

46 Claims, 9 Drawing Sheets

CHEMICAL MECHANICAL POLISHING METHOD, POLISHER USED IN CHEMICAL MECHANICAL POLISHING AND METHOD OF MANUFACTURING SEMICONDUCTOR DEVICE

BACKGROUND OF THE INVENTION

The present invention relates to a method of manufacturing a semiconductor device, and more specifically to a chemical mechanical polishing (to be abbreviated as CMP hereinafter) method, a polisher used in CMP, and a method of manufacturing a semiconductor device, which employs the CMP method.

With reference to FIGS. 1A to 1E, the smoothing process which employs a conventional CMP method, in a semiconductor device manufacturing method, will now be described. Each of FIGS. 1A to 1E is a cross sectional view illustrating a stage in a smoothing process which employs the conventional CMP method.

Figure 1A:
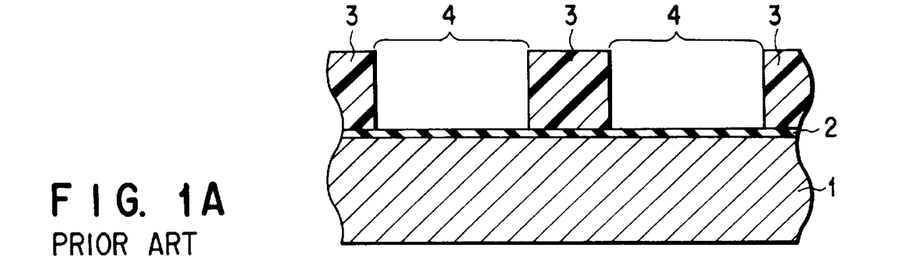
FIGS. 1A to 1E are cross sectional views each showing a stage in a smoothing step which employs a conventional CMP method.

Before carrying out the smoothing process employing the conventional CMP method, as can be seen in FIG. 1A, a silicon oxide film ($SiO_2$ film) or a silicon nitride film ($Si_3N_4$ film), which serves as a polishing stopper film 2, is formed on a silicon substrate 1. Then, photoresist is applied on the stopper film 2 to form a photoresist layer 3. Windows 4 having a predetermined pattern are made in the photoresist layer 3.

Figure 1B:
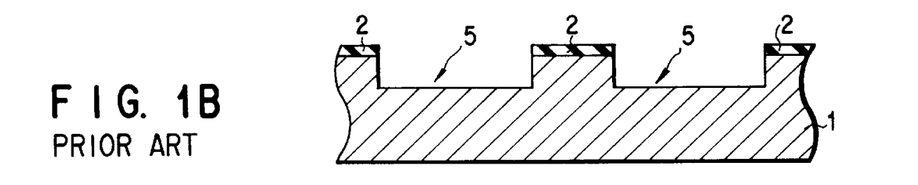

Next, as can be seen in FIG. 1B, the stopper film 2 and the silicon substrate 1 are etched with use of the photoresist layer 3 as a mask, so as to make a groove 5 in the silicon substrate 1. The photoresist layer 3 is removed after making the groove 5.

Figure 1C:
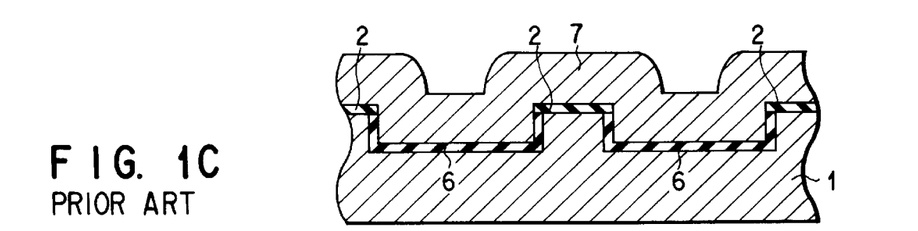

Further, as can be seen in FIG. 1C, the surface of the silicon substrate 1 which is exposed as the groove 5 was made, is oxidized to form a silicon oxide film ($SiO_2$ film) 6. Then, silicon is deposited on the silicon oxide film 6 to form a silicon film 7 having a thickness larger than the depth of the groove 5. Thus, the groove 5 is filled and covered with the silicon film 7. The configuration of the surface of the silicon film 7 reflects the irregularity (projections and recesses) of the surface of the silicon substrate 1.

Figure 1D:
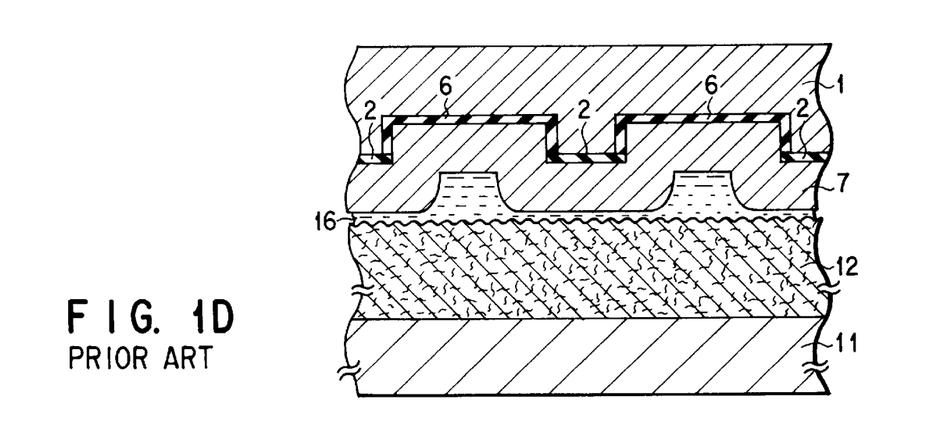

Next, as can be seen in FIG. 1D, the irregularity of the surface of the silicon film 7 is smoothed by the CMP method. More specifically, while supplying a polisher 16 on a polishing cloth 12 provided on a turn table 11 of a CMP device, the surface of the turn table 11 is pressed on the polishing cloth. As the turn table 11 and the substrate 1 are rotated while maintaining the above state, the projections of the silicon film 7 are polished by the polishing cloth 12 and the polisher 16, and gradually smoothed. The polisher 16 is a basic solution such as organic amine, which contains polishing particles of silica or the like. The polishing is stopped when the stopper film 2 is exposed.

The smoothing step employing the conventional CMP method is carried out in the above-described manner. The shape of the substrate 1 after the completion of the smoothing is shown in FIG. 1E.

Figure 1E:
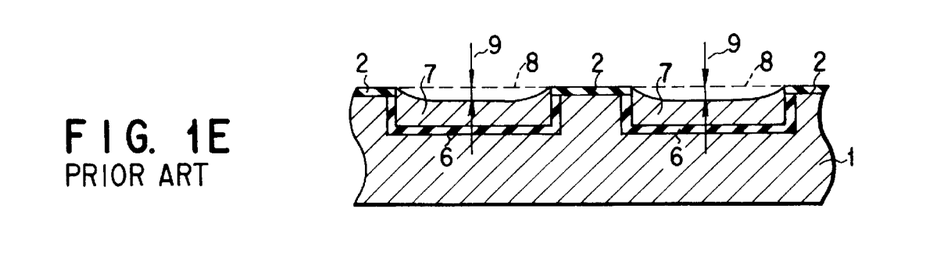

As can be seen in FIG. 1E, with the conventional CMP method, the surface of the silicon film 7 is polished to a level lower than the level of the surface of the stopper film 2, and therefore a depression 9 is made in the surface of the silicon film 7. This phenomenon is called "dishing", which may cause the following problem.

Figure 2A:
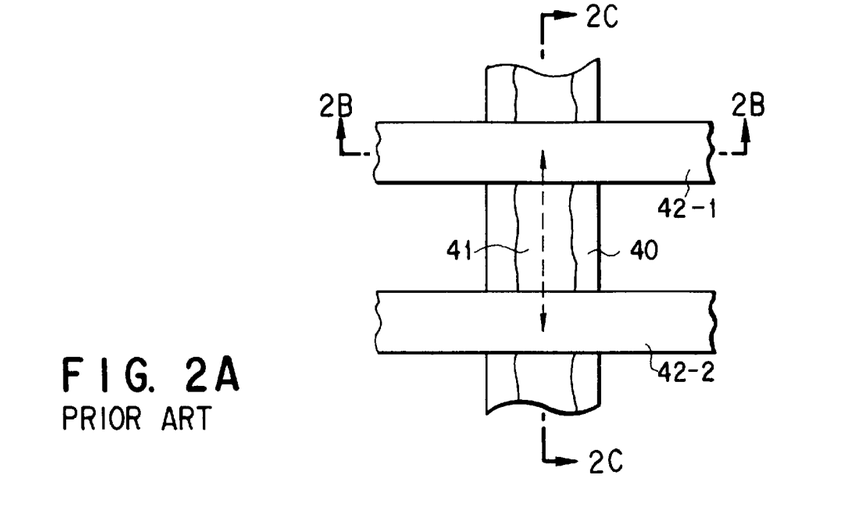
FIG. 2A is a plan view of a semiconductor device in which an element separation region is formed by use of the conventional CMP method.
Figure 2B:
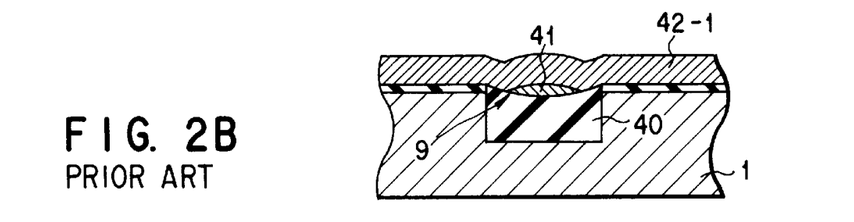
FIGS. 2B and 2C are cross sectional views taken along the lines 2B—2B and 2C—2C, respectively, in FIG. 2A.
Figure 2C:
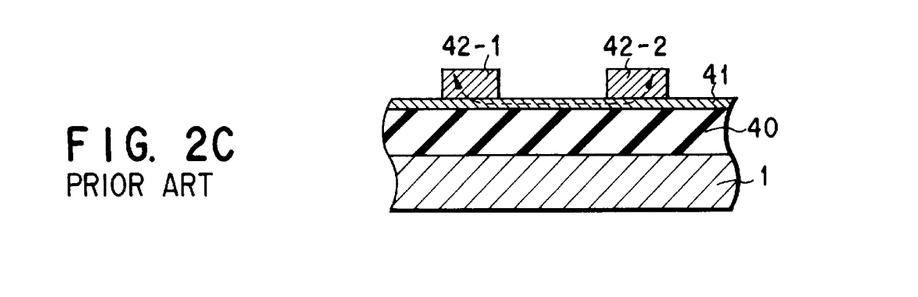

That is, for example, in the case where an element separation region is formed by the CMP method, an undesired film remain in the depression 9 in some cases. Especially, if an electro-conductive film remains in the depression 9, wires are shortcircuited by the remaining conductive film. As a result, the yield of the production is decreased. FIGS. 2A to 2C show an example of a shortcircuit occurred between wires. FIG. 2A is a plan view of the shortcircuit between wires, FIG. 2B is a cross sectional view taken along the line 2B—2B in FIG. 2A, and FIG. 2C is a cross sectional view taken along the line 2C—2C in FIG. 2A.

As can be seen in FIGS. 2A to 2C, an element separation region 40 is embedded in the silicon substrate 1 by the CMP method. A depression 9 is made in the surface of the element separation region 40, and a conductive film 41 remains in the depression 9. As a result, wires 42-1 and 42-2 which are in contact with the element separation region 40 and arranged to be a predetermined distance away from each other, are electrically connected to each other via the conductive film 41. In other words, a electrical shortcircuit takes place between the wires 42-1 and 42-2.

Figure 3:
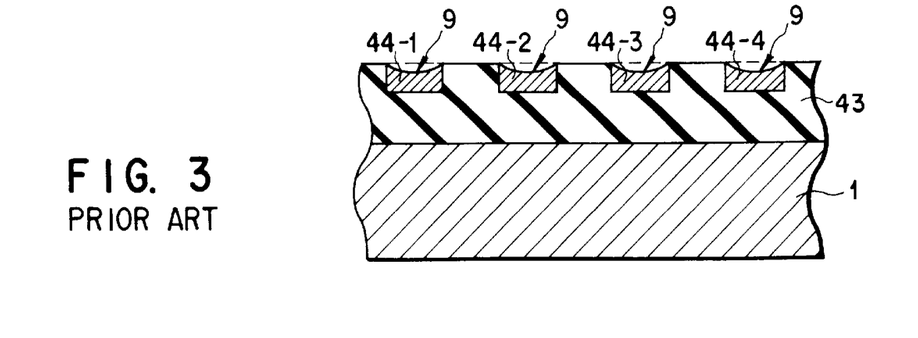
FIG. 3 is a cross sectional view of a semiconductor integrated circuit manufactured by the conventional CMP method.

Further, for example, in the case where the internal wiring of a semiconductor integrated circuit device is formed by the CMP method, the depression 9 causes decrease in the cross sectional area of the internal wiring, thus increasing the electrical resistance of the internal wiring. This phenomenon is called "attenuation of wiring". FIG. 3 shows an example of the "attenuation of wiring".

FIG. 3 is a cross sectional view of a semiconductor integrated circuit device. In this figure, an interlayer insulating film 43 is formed on the silicon substrate 1. In the interlayer insulating film 43, internal wires 44-1 to 44-4 are formed as they are embedded, by the CMP method. A depression is made in each of the internal wires 44-1 to 44-4. Therefore, the cross sectional area of each of the internal wires 44-1 to 44-4 is rendered smaller than the original cross sectional area shown by a broken line in the figure, by a portion corresponding to the depression 9. As a result, the resistance of each of the internal wires 44-1 to 44-4 is increased.

As described above, the "dishing" causes a shortcircuit between wires, and an increase in resistance of internal wires, and therefore the production yield of semiconductor device is lowered.

BRIEF SUMMARY OF THE INVENTION

The present invention has been proposed in consideration of the above-described drawback of the conventional technique, and an object thereof is to provide a chemical-mechanical polishing method capable of suppressing the formation of a "dishing" in the film to be polished, thus making a smoother surface, as well as a polisher used in such a method.

Another object of the present invention is to provide a method of manufacturing a semiconductor device at high production yield, which employs a chemical-mechanical polishing method.

In order to achieve the above-described object, there is provided, according to the present invention, a chemical-mechanical polishing method having the step of subjecting a film to be polished, provided on a main surface of a substrate, and having a projection portion and a recess portion on a surface thereof, to polishing and etching, wherein the projection portion of the film to be polished is mechanically polished and chemically etched while covering the recess portion with a protective film to protect it from being chemically etched by supplying a protecting agent on the film to be polished.

Further, the present invention provides a chemical-mechanical polishing method having the steps of: subjecting a film to be polished, provided on a main surface of a substrate, and having a projection portion and a recess portion on a surface thereof, to covering of the recess portion with a covering film to protect it from being chemically etched; and mechanically polishing and chemically etching the projection portion of the film to be polished, the recess portion of which is covered by the covering film.

The present invention still further provides a polisher used for chemical-mechanical polishing having: polishing particles for mechanically polishing a film to be polished, provided on a main surface of a substrate; an etching solution for chemically etching the film to be polished; and a protecting agent for forming a protective film which covers the film to be covered, and protects a surface of the film to be processed, from the polishing and etching.

The present invention still further provides a method of manufacturing a semiconductor device, comprising the steps of: making a recess portion and a projection portion on one main surface of a substrate; forming a film to be polished, having a recess portion and a projection portion on its surface, on the main surface of the substrate on which the recess portion and projection portion are made, the recess portion and the projection portion of the film to be polished, being situated to correspond to the recess portion and the projection portion of the main surface of the substrate, and a thickness of the film to be polished in the recess portion of the substrate being larger than a height of the projection portion of the substrate; and mechanically polishing and chemically etching the projection portion of the film to be polished while covering the recess portion of the film to be polished, to protect it with a protective film from being etched by supplying a protecting agent on the film to be polished.

The present invention still further provides a method of manufacturing a semiconductor device, comprising the steps of: making a recess portion and a projection portion on one main surface of a substrate; forming a film to be polished, having a recess portion and a projection portion on its surface, on the main surface of the substrate on which the recess portion and projection portion are made, the recess portion and the projection portion of the film to be polished, being situated to correspond to the recess portion and the projection portion of the main surface of the substrate, and a thickness of the film to be polished in the recess portion of the substrate being larger than a height of the projection portion of the substrate; covering the recess portion of the film to be polished, with a covering film, from being chemically etched; and mechanically polishing and chemically etching the projection portion of the film to be polished, the recess portion of which is covered by the covering film.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL
VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE
INVENTION

The present invention will now be described in more detail with reference to accompanying drawings.

According to the first embodiment of the present invention, an insulating film is provided on a semiconductor substrate having an irregular (projection and recess) surface such that the configuration of the insulating film follows the irregularity of the surface of the substrate. And, a semiconductor is embedded in the recess of the insulating film such that the surface of the substrate is made flat.

Figure 4A:
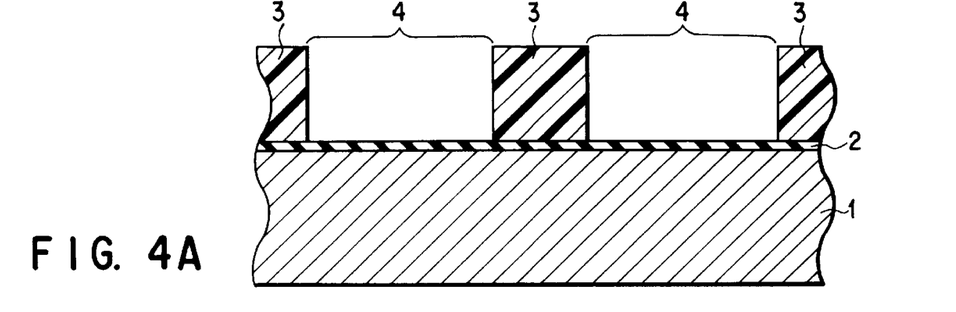
FIGS. 4A to 4C are cross sectional views each showing a stage in a smoothing step which employs a CMP method according to the first embodiment of the present invention.
Figure 4B:
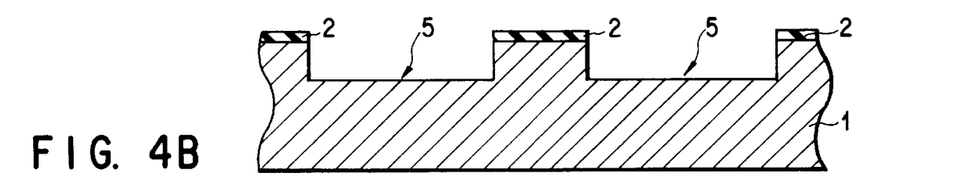
Figure 4C:
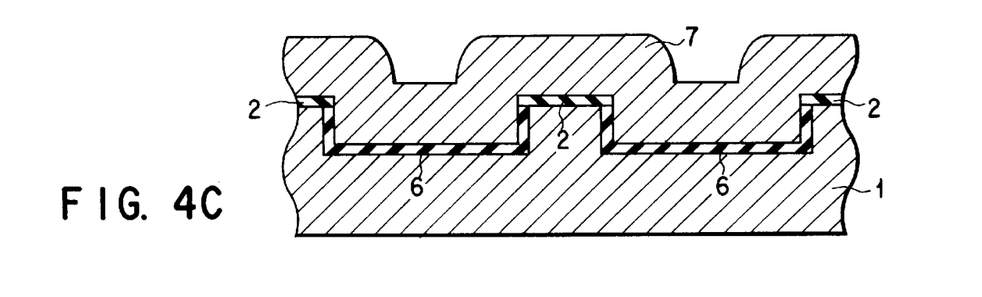

FIGS. 4A to 4C are diagrams illustrating the smoothing process which employs the CMP method according to the first embodiment of the present invention. These figures are cross sections each showing a stage of the process.

First, as can be seen in FIG. 4A, a silicon oxide film ($SiO_2$ film) or a silicon nitride film ($Si_3N_4$ film), which serves as a polishing stopper film 2, is formed on a silicon substrate 1. Then, photoresist is applied on the stopper film 2 to form a photoresist layer 3. Windows 4 having a predetermined pattern are made in the photoresist layer 3.

Next, as can be seen in FIG. 4B, the stopper film 2 and the silicon substrate 1 are etched with use of the photoresist layer 3 as a mask, so as to make a groove 5 in the silicon substrate 1. The groove 5 is made to have, for example, a width of 0.3 $\mu$m or more and a depth of about 0.3 to 10 $\mu$m. The photoresist layer 3 is removed after making the groove 5.

Further, as can be seen in FIG. 1C, the exposed surface of the silicon substrate 1 at the position of the groove 5, is oxidized to form a silicon oxide film ($SiO_2$ film) 6. Then, silicon is deposited on the silicon oxide film 6 and the stopper film 2 to form a silicon film 7 serving as a film to be polished and having a thickness larger than the depth of the groove 5. Thus, the groove 5 is filled and covered with the silicon film 7. The configuration of the surface of the silicon film 7 reflects the irregularity (projection and recess) of the surface of the silicon substrate 1.

Figure 5:
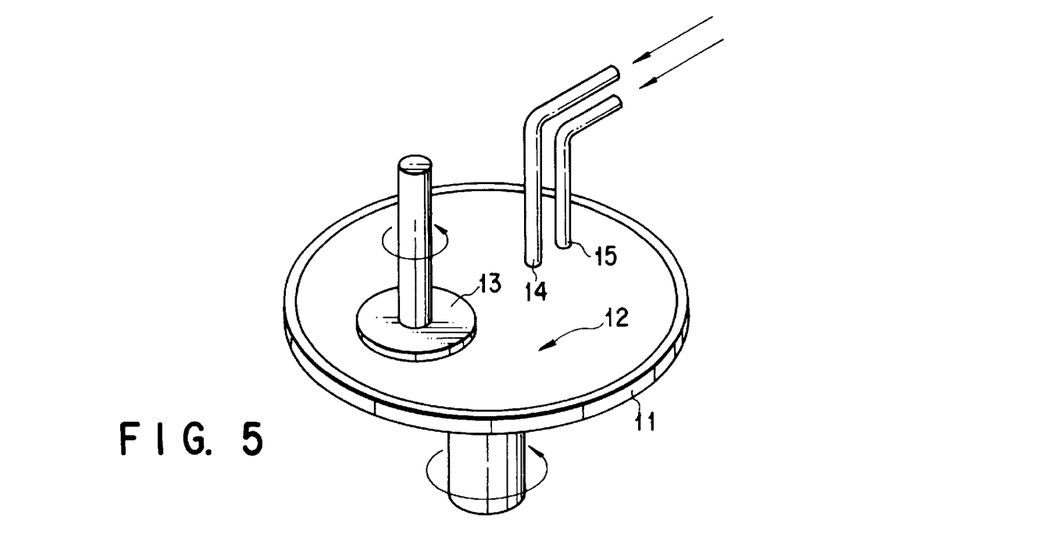
FIG. 5 is a perspective view of a CMP apparatus employed in the first to third embodiments of the present invention.

Next, with use of a CMP apparatus shown in FIG. 5, the irregularity on the surface of the silicon film 7 is smoothed.

FIG. 5 is a perspective view schematically showing the CMP apparatus. The CMP apparatus has a turn table 11 which is rotatable. A polishing cloth 12 is fixed on the turn table 11. A top ring 13, and nozzles 14 and 15 are arranged above the turn table 11. The top ring 13 serves to rotate the substrate while holding it, and is capable of moving such that the surface of the substrate to be polished is brought into contact with the polishing cloth 12. The nozzles 14 and 15 are used to supply the polisher, etching solution and the like, to the polishing cloth 12.

The CMP process according to the first embodiment of the present invention, which employs a CMP apparatus having the above-described structure, will now be described with reference to FIG. 6.

Figure 6:
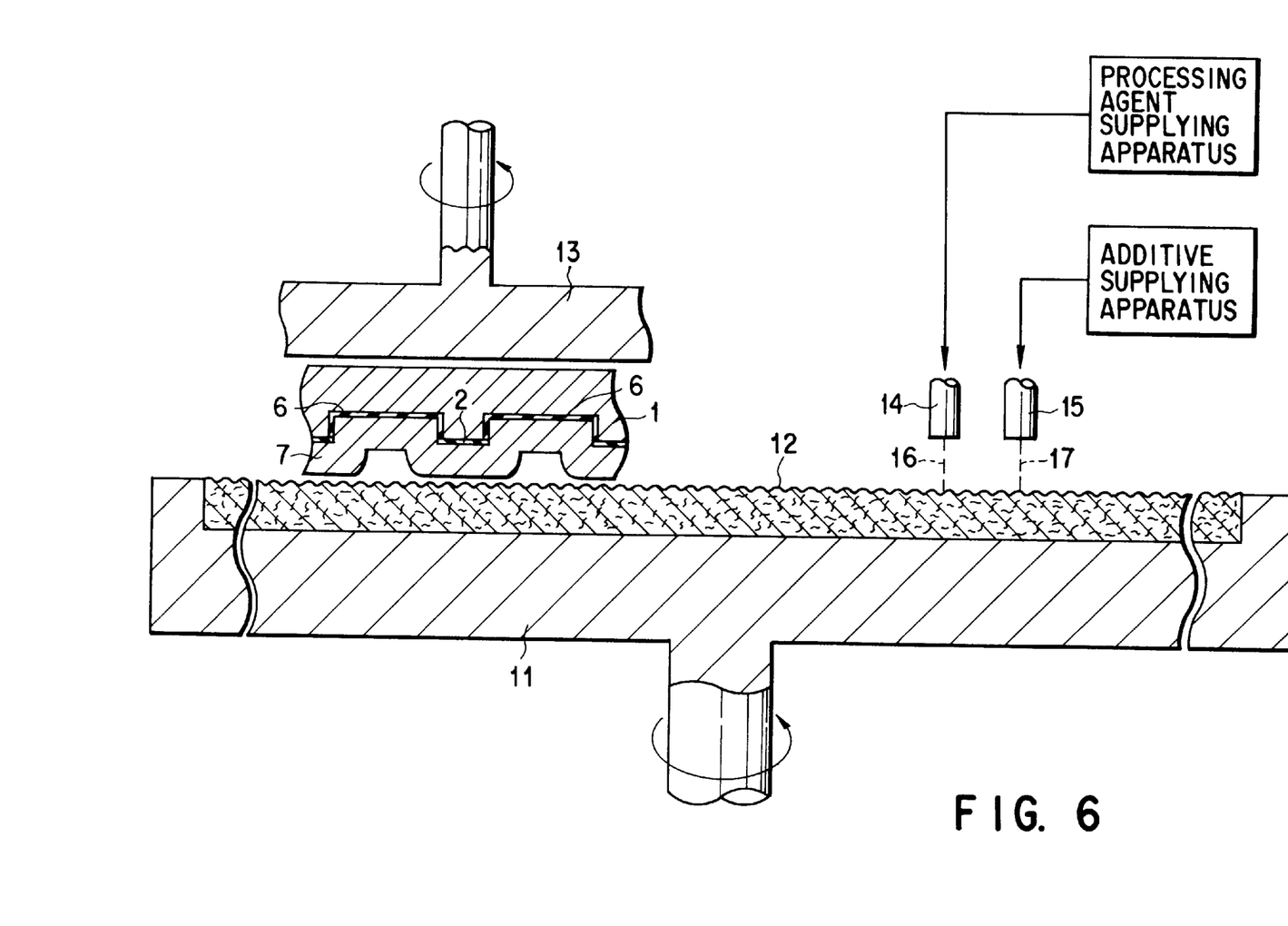
FIG. 6 is a cross sectional view schematically showing the CMP step of the first embodiment of the present invention.

FIG. 6 is a cross sectional view schematically showing the CMP process according to the first embodiment of the present invention. The CMP process of the first embodiment is carried out in the following manner. First, the silicon substrate 1 is fixed on the top ring 13 so that its surface to be polished, that is, the silicon film 7, faces the polishing cloth 12. Then, the top ring 13 is moved such that the silicon film 7 is brought into contact with the polishing cloth 12, and while the top ring 13 and the polishing cloth 12 being pressed to each other, the top ring 13 and the polishing cloth 12 are rotated.

During this period, a processing agent 16, which is a mixture of an etching solution and a polisher, is supplied via the nozzle 14, and a protecting agent 17 via the nozzle 15, both at the same time onto the polishing cloth 12 drop by drop. In the first embodiment, a basic solution is used as the etching solution, and a dispersion dispersing polishing particles in water, is used as the polisher. The protecting agent 17 is a solution containing a hydrophilic polysaccharide or the like. The processing agent 16 and the protecting agent 17 are mixed on the polishing cloth 12, and supplied onto the surface of the silicon film 7.

Figure 7A:
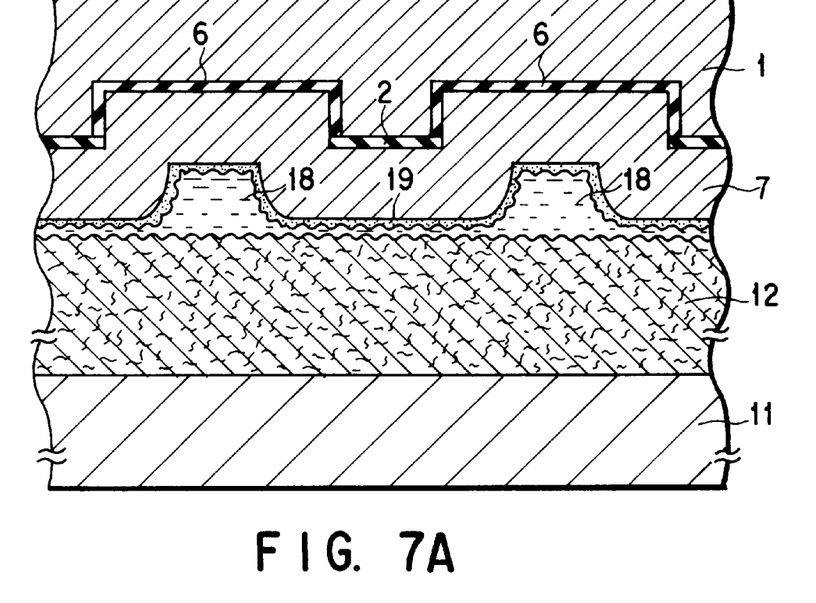
FIGS. 7A and 7B are cross sectional views each showing a state of the silicon film polished by the CMP method of the first embodiment of the present invention.
Figure 7B:
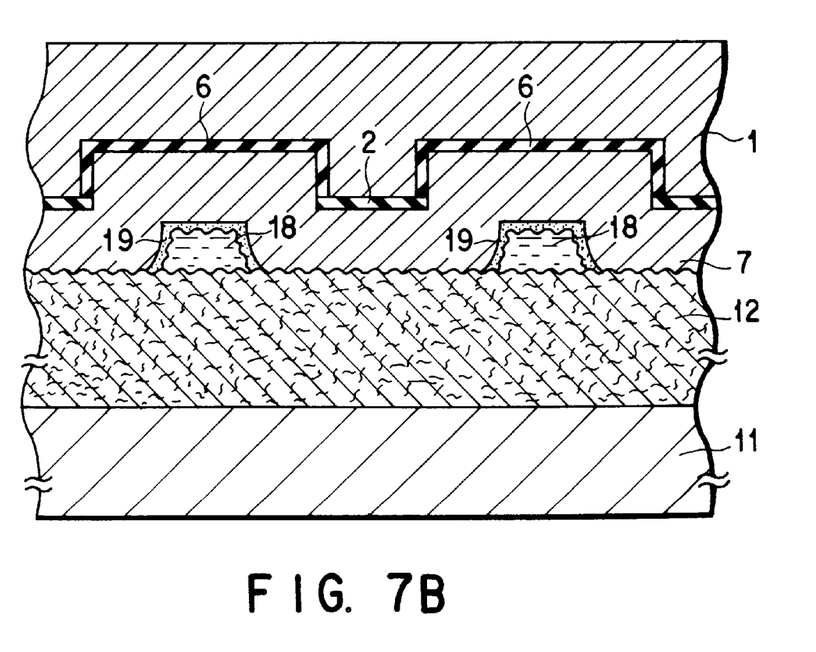

The silicon film 7, to which the processing agent 16 and the protecting agent 17 are supplied, is polished as can be seen in FIGS. 7A and 7B.

FIGS. 7A and 7B are cross sections each illustrating a state of the silicon film 7 polished. As shown in FIG. 7A, a mixture solution 18 of the processing agent 16 and the protecting agent 17 is supplied on the surface of the silicon film 7, and the hydrophilic polysaccharide contained in the mixture solution 18 forms a protective film 19 on the surface of the silicon film 7.

The portion of the protective film 19, which is formed on a projection of the silicon film 7 is removed as it is mechanically polished with the polishing cloth 12 and the polishing powder in the mixture solution 18. As a result, as can be seen in FIG. 7B, the projection of the silicon film 7 is exposed, and then it is chemically etched by the basic solution component contained in the mixture solution 18.

In the case where the etching is performed without using the polishing powder, the etching rate is generally lowered since the reaction product of the etching serves to cover the surface of the silicon film 7 to be processed. However, the bond between the etching reaction product and the surface to be processed is very weak. Therefore, with the polishing powder contained in the mixture solution 18, the etching reaction product can be easily stripped off, thus preventing the lowering of the etching rate.

In the meantime, the other portion of the protective film 19, which is formed on the recess of the silicon film 7, is not brought into contact with the polishing cloth 12, and therefore this portion remains to cover the recess of the silicon film 7 without being removed. Even if this portion of the protecting film 19 is damaged for some reason, the damaged section is immediately recovered since the hydrophilic polysaccharide is supplied from the mixture solution 18. In this manner, the recess of the silicon film 7 is protected from being chemically etched.

When the above-described etching and polishing are continued until the stopper film 2 formed on the projection of the silicon substrate 1 is exposed while protecting the recess of the silicon film 7 with the protective film 19, the projection of the silicon film 7 is completely removed, and thus the silicon substrate 1 is smoothed.

Figure 8:
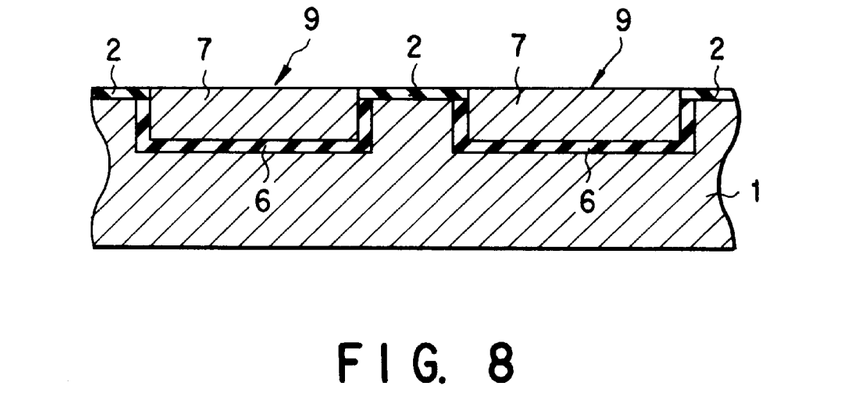
FIG. 8 is a cross sectional view of a semiconductor device smoothed by the CMP method of the first embodiment of the present invention.

FIG. 8 shows a cross section of a semiconductor device smoothed by the CMP method as above. As shown in this figure, with the CMP method according to the first embodiment of the present invention, the recess of the silicon film 7, as it is covered by the protective film 19, is protected from being chemically etched by the basic solution, and therefore the depression 9 (dishing) formed in the surface of the silicon film 7 can be significantly suppressed as compared to the conventional technique.

By employing the CMP method of the first embodiment as described above, a smoothing process was actually carried out (sample A). As the protecting agent, an aqueous solution of hydrophilic polysaccharide was used. The depth of the projection (or recess) resulting between the stopper film 2 and the silicon oxide film 6 is set to 0.8 $\mu$m, and the width was set to 100 $\mu$m. The recess was filled and covered with the silicon film 7. Meanwhile, another smoothing process was carried out by the same CMP method as above except that hydrophilic polysaccharide was not used (sample B). The samples A and B were examined in terms of the dishing amount. The results of the examination were illustrated in FIG. 9 and FIGS. 10A and 10B.

Figure 9:
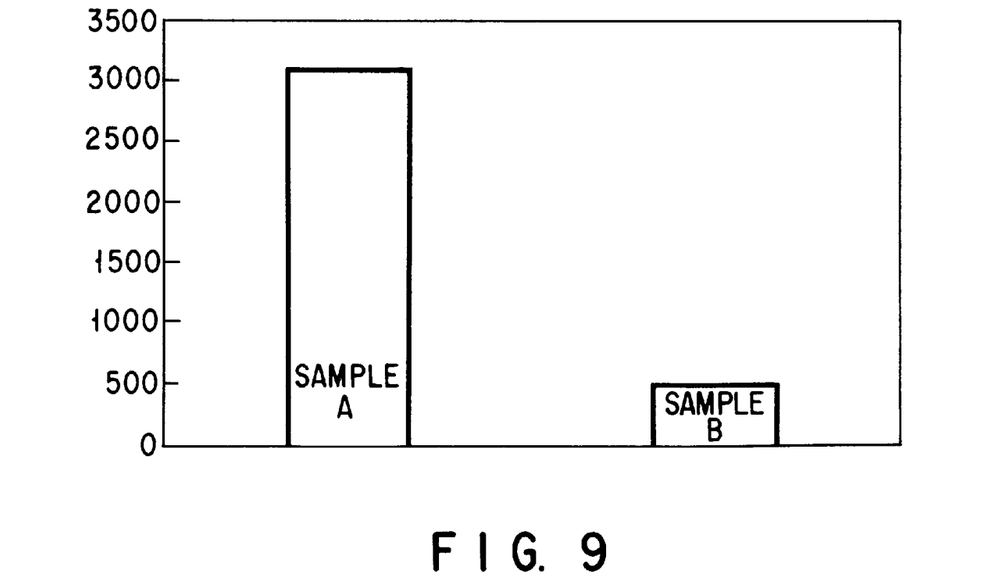
FIG. 9 is a graph showing the depth of the dishing of a semiconductor device prepared by the CMP method of the first embodiment of the present invention, and that of a semiconductor device prepared by the conventional CMP method.

FIG. 9 is a graph illustrating the dishing amount of the semiconductor device (sample A) manufactured by the conventional CMP method, along with the dishing amount of the device (sample B) manufactured by the CMP method according to the first embodiment of the present invention. In this figure, the vertical axis indicates the dishing amount (that is, the depth of the recess 9).

Figure 10A:
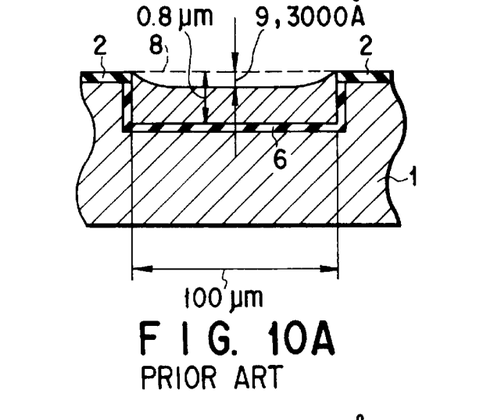
FIG. 10A is a cross sectional view of the semiconductor device prepared by the conventional CMP method.
Figure 10B:
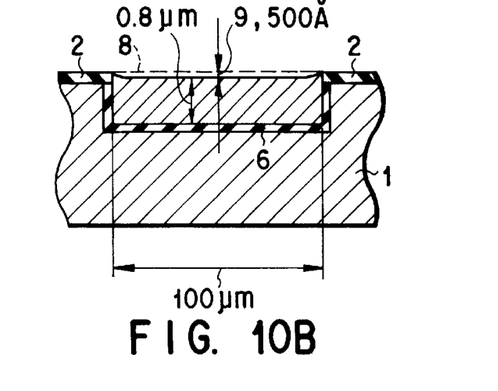
FIG. 10B is a cross section view of the semiconductor device (sample B) prepared by the CMP method of the first embodiment of the present invention.

FIG. 10A is a cross sectional view of the semiconductor device (sample A) manufactured by the conventional CMP method, and FIG. 10B is a cross sectional view of the semiconductor device (sample B) manufactured by the CMP method of the first embodiment. It should be noted that in FIGS. 10A and 10B, the broken line 8 indicates the level of the surface of the stopper film 2.

As can be understood from FIG. 9 and FIGS. 10A and 10B, the depth of the dishing of the sample A manufactured by use of the conventional CMP method was about 3000 Å, whereas the depth of the dishing of the sample B manufactured by the CMP method of the first embodiment was 500 Å. That is, with the CMP method of the first embodiment, the depth of the dishing was reduced to about one sixth of that of the conventional technique.

As described above, with the first embodiment of the present invention, an insulating film is formed on a semiconductor substrate having an irregular surface (projection and recess), such that the configuration of the insulating film follows the irregular surface of the semiconductor substrate, and semiconductor is embedded into the recess of the insulating film. In this manner, a semiconductor device can be manufactured without making a deep dishing.

The CMP method according to the first embodiment of the present invention described above can be applied to, for example, a trench-type element separation used in a bipolar type IC. When the CMP method is applied to the trench-type element separation, the probability of the occurrence of electrical shortcircuit between wires can be reduced since the remaining of other films in the depression 9 of the silicon film 7 can be suppressed. Consequently, the production yield of the semiconductor integrated circuit device which employs the trench-type element separation, can be improved.

Further, in the first embodiment, the crystal structure of the silicon film to be polished may be any of single crystal, amorphous (amorphous silicon) and polycrystal (polycrystal silicon). The silicon film may be any of the type which contains conductive impurities (doped silicon) and that does not contain conductive impurities (undoped silicon).

The second embodiment of the present invention will now be described. The CMP method of the second embodiment of the present invention is used for a STI (shallow trench isolation) method, in which an insulating material is embedded in a recess of a semiconductor substrate having an irregular surface, such that the surface of the substrate is smoothed, thereby forming an element separation region.

FIGS. 11A to 11E are diagrams illustrating the smoothing process which employs the CMP method according to the second embodiment of the present invention. These figures are cross sections each showing a stage of the process.

Figure 11A:
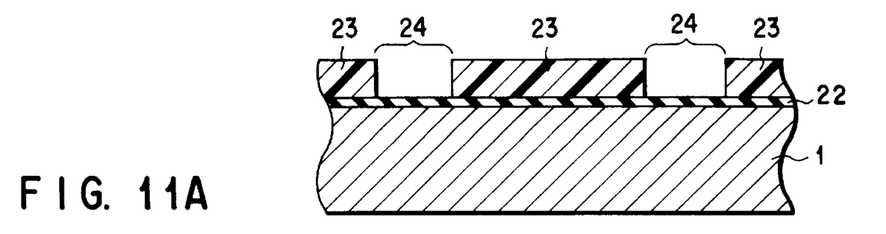
FIGS. 11A to 11E are cross sectional views each showing a stage of the smoothing step which employs the CMP method according to the second embodiment of the present invention.

First, as can be seen in FIG. 11A, a silicon film (Si film) or a silicon nitride film ($Si_3N_4$ film), which serves as a polishing stopper film 22, is formed on a silicon substrate 1. Then, photoresist is applied on the stopper film 22 to form a photoresist layer 23. Windows 24 having a predetermined pattern are made in the photoresist layer 23.

Figure 11B:
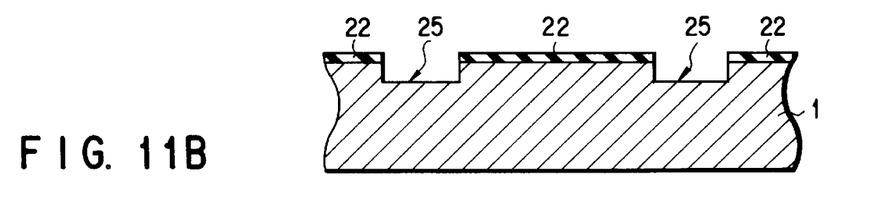

Next, as can be seen in FIG. 11B, the stopper film 22 and the silicon substrate 1 are etched with use of the photoresist layer 23 as a mask, so as to make a groove 25 which corresponds to an STI pattern, in the silicon substrate 1. The groove 5 is made to have, for example, a width of 0.3 $\mu$m or more and a depth of about 0.3 to 10 $\mu$m. The photoresist layer 23 is removed after making the groove 25.

Figure 11C:
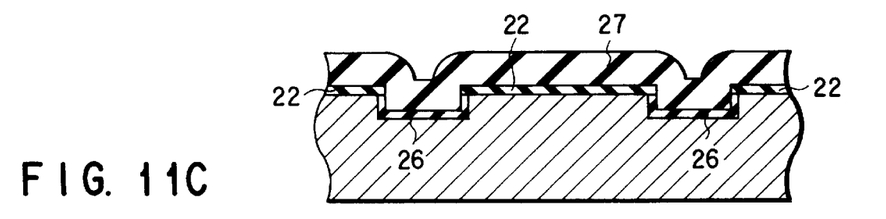

Further, as can be seen in FIG. 11C, the exposed surface of the silicon substrate 1 at the position of the groove 25, is oxidized to form a silicon oxide film ($SiO_2$ film) 26. Then, silicon dioxide is deposited on the silicon oxide film 26 and the stopper film 22 to form a silicon dioxide film 27 serving as a film to be polished and having a thickness larger than the depth of the groove 25. Thus, the groove 25 is filled and covered with the silicon dioxide film 27. The configuration of the surface of the silicon dioxide film 27 reflects the irregularity (projection and recess) of the surface of the silicon substrate 1.

Figure 11D:
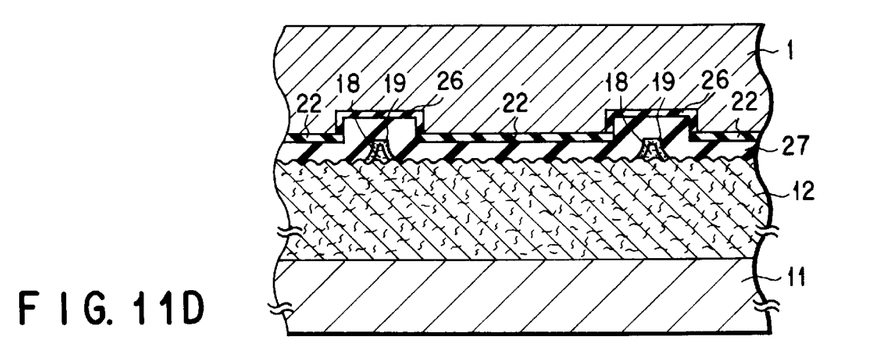

Next, with use of a CMP apparatus shown in FIG. 5, the irregularity on the surface of the silicon dioxide film 27 is smoothed. FIG. 11D shows the semiconductor substrate 1 which is being polished.

Figure 11E:
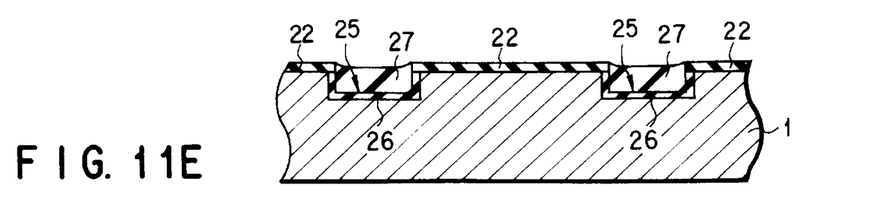

As can be seen in FIG. 11D, the silicon oxide film 27 is subjected to chemical-mechanical polishing (CMP) with use of the mixture solution 18 containing a processing agent and a protecting agent, in a manner similar to that of the first embodiment. Since the mixture solution 18 contains the protecting agent, a protective film 19 is formed on the surface of the silicon oxide film 27 as in the first embodiment. Thus, only the projection of the silicon oxide film 27 is selectively removed gradually as it is mechanically polished as well as chemically etched, while protecting the depression of the silicon oxide film 27 with the protective film 19, from being chemically etched. Eventually, the projection of the silicon oxide film 27 is completely removed as shown in FIG. 11E, and only the portion of the silicon oxide film 27, which is embedded in the groove 25, remains, thereby smoothing the surface of the substrate 1. Thus, an element separation region is formed by the STI method.

Figure 12A:
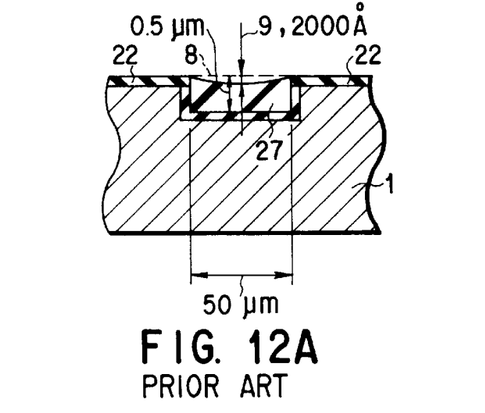
FIG. 12A is a cross sectional view of a semiconductor device in which an element separation region is formed by the conventional CMP method.
Figure 12B:
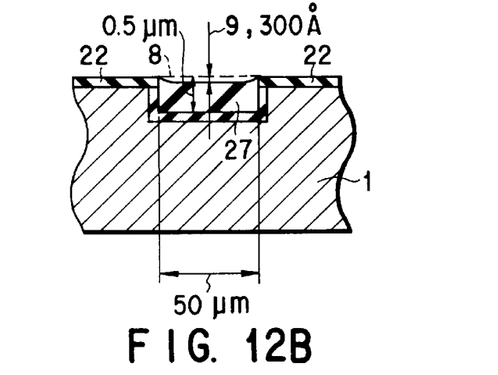
FIG. 12B is a cross sectional view of a semiconductor device in which an element separation region is formed by the conventional CMP method according to the second embodiment of the present invention.

FIG. 12A is a cross sectional view of a semiconductor device in which an element separation region is formed by the conventional CMP method, and FIG. 12B is a cross sectional view of a semiconductor device in which an element separation region is formed by the CMP method according to the second embodiment of the present invention.

As shown in FIG. 12A, in the case where an element separation region is formed by the conventional CMP method which does not employs a protecting agent, a large depression 9 (dishing) is formed in the surface of the silicon oxide film 27. By contrast, with use of a protecting agent, the size of the depression 9 formed in the silicon oxide film 27 can be reduced as can be seen in FIG. 12B. Consequently, the remaining of other films in the depression 9 can be prevented, thereby making it possible to suppress the occurrence of the electrical shortcircuit between wires. Therefore, the production yield of the semiconductor integrated circuit device in which an element separation region is formed by the STI method, can be enhanced.

As described above, the present invention can be applied not only to the step where silicon is embedded in a groove and then smoothed, but also to an STI step where silicon dioxide is embedded in a groove, and then smoothed. In the STI step, the same effect as that of the first embodiment can be obtained.

Other examples of the insulating material used in the second embodiment, than silicon dioxide, are silicon nitride ($Si_3N_4$) and the like. When silicon nitride or the like is employed, the same effect as in the case of silicon dioxide, can be achieved.

In the first and second embodiments described above, a basic solution can be used as the etching solution. Examples of the basic solution are aqueous solutions of organic amine, sodium hydroxide, potassium hydroxide and the like. The concentration of the basic solution is adjusted such that pH of the solution becomes about 9 to 11.

Next, the third embodiment of the present invention will now be described. The CMP method of the third embodiment is employed in a damascene method in which an interlayer insulating film is provided on a recess of a semiconductor substrate having an irregular (projection and recess) surface, and a metal material having a low electrical resistance is embedded in the recess such that the surface of the substrate is smoothed, thereby forming an internal wiring.

FIGS. 13A to 13E are diagrams illustrating the smoothing process which employs the CMP method according to the third embodiment of the present invention. These figures are cross sections each showing a stage of the process.

Figure 13A:
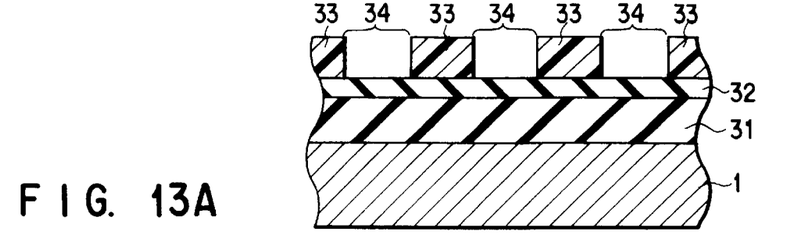
FIGS. 13A to 13E are cross sectional views each showing a stage of the smoothing step which employs the CMP method according to the third embodiment of the present invention.

First, as can be seen in FIG. 13A, a silicon oxide film ($SiO_2$ film), which serves as a first interlayer insulating film 31, is formed on a silicon substrate 1. The surface of the first interlayer insulating film 31 is smoothed, and then a silicon oxide film ($SiO_2$ film), which serves as a second interlayer insulating film 32, is formed on the first interlayer insulating film 31. After that, photoresist is applied on the second interlayer insulating film 32 to form a photoresist layer 33. Windows 34 having a predetermined pattern are made in the photoresist layer 33.

Figure 13B:
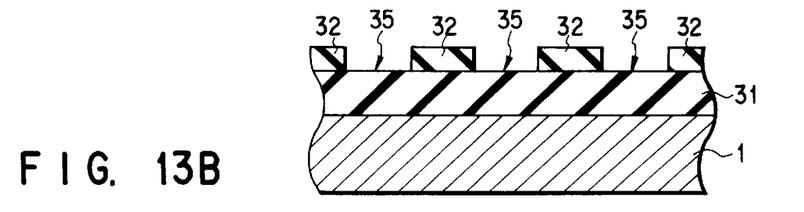
Figure 13C:
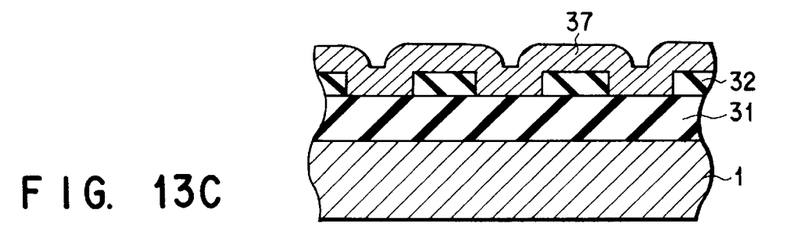

Next, as can be seen in FIG. 13B, the second interlayer insulating film 32 is etched with use of the photoresist layer 33 as a mask, so as to make a groove 35 which corresponds to an internal wiring pattern, in the second interlayer insulating film 32. The groove 35 is made to have, for example, a width of 0.3 $\mu$m or more and a depth of about 0.4 $\mu$m or more. The photoresist layer 33 is removed after making the groove 35.

Further, as can be seen in FIG. 11C, a metal having a low electric resistance, such as copper (Cu) is deposited on the first and second interlayer insulating films 31 and 32 by a CVD technique or the like, to form a metal film 37 serving as a film to be polished and having a thickness larger than the depth of the groove 35. Thus, the groove 25 is filled and covered with the metal film 37. The configuration of the surface of the metal film 37 reflects the irregularity (projection and recess) resulting by the first and second interlayer insulating films 31 and 32.

Figure 13D:
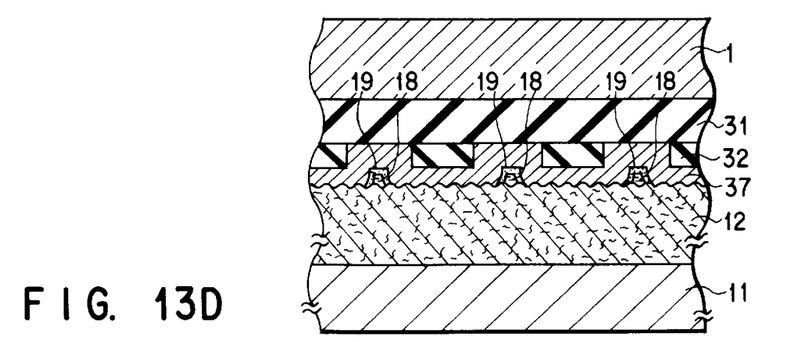

Next, with use of a CMP apparatus shown in FIG. 5, the irregularity on the surface of the metal film 37 is smoothed. FIG. 13D shows the semiconductor substrate 1 which is being polished.

Figure 13E:
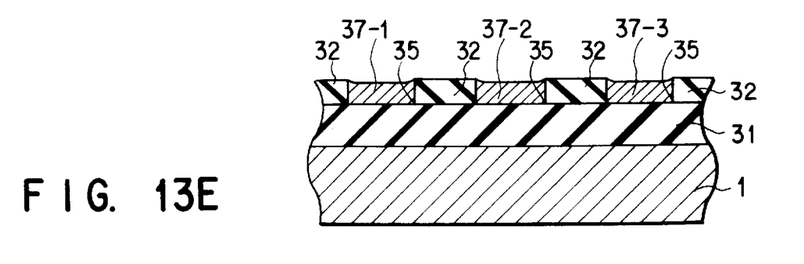

As can be seen in FIG. 13D, the metal film 37 is subjected to chemical-mechanical polishing (CMP) with use of the mixture solution 18 containing a processing agent and a protecting agent, in a manner similar to that of the first embodiment. Since the mixture solution 18 contains a hydrophilic polysaccharide added thereto, a protective film 19 is formed on the surface of the metal film 37 as in the first embodiment. Thus, only the projection of the metal oxide film 37 is selectively removed gradually as it is mechanically polished as well as chemically etched, while protecting the depression of the metal film 37 with the protective film 19, from being chemically etched. Eventually, the projection of the metal film 37 is completely removed as shown in FIG. 13E, and only the portion of the metal film 37, which is embedded in the groove 35, remains, thereby smoothing the surface of the substrate 1. Thus, internal wires 37-1 to 37-3 are formed by the damascene method.

Figure 14A:
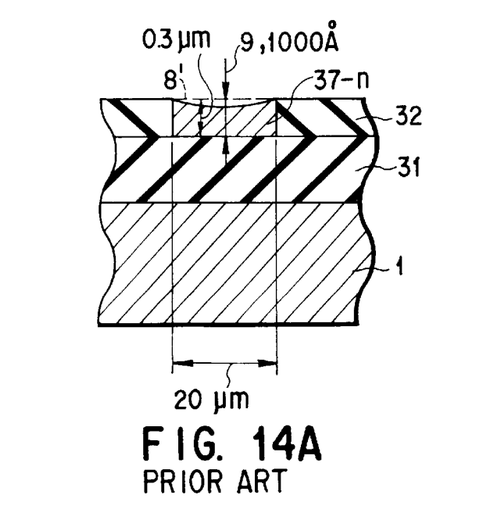
FIG. 14A is a cross sectional view of a semiconductor device in which an internal wire is formed by the conventional CMP method.
Figure 14B:
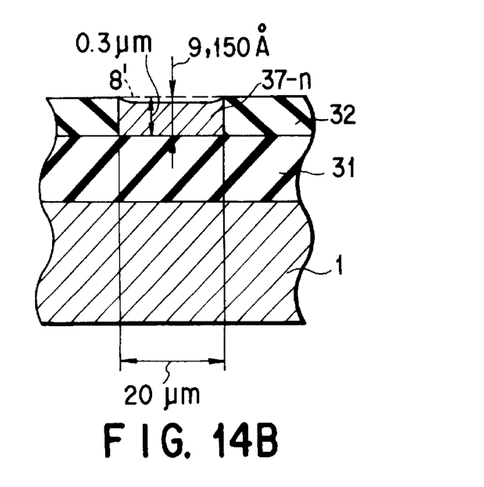
FIG. 14B is a cross sectional view of a semiconductor device in which an internal wire is formed by the conventional CMP method according to the third embodiment of the present invention.

FIG. 14A is a cross sectional view of a semiconductor device in which the internal wiring is formed by the conventional CMP method, and FIG. 14B is a cross sectional view of a semiconductor device in which the internal wiring is formed by the CMP method according to the third embodiment of the present invention. In the figures, the broken line 8 indicates the level of the surface of the second interlayer insulating film 32.

As shown in FIG. 14A, in the case where internal wires are formed by the conventional CMP method which does not employs a protecting agent, a large depression 9 (dishing) is formed in the surface of the internal wires 37-n. By contrast, with use of a protecting agent, the size of the depression 9 formed in the internal wire 37-n can be reduced as can be seen in FIG. 14B. Consequently, the reduction in the cross section of the internal wires 37-n, caused by the large depression 9 formed, can be suppressed. As a result, the increase in the electrical resistance of the semiconductor integrated circuit device in which the internal wires are formed by the damascene method, can be suppressed.

As described, the present invention can be applied to the damascene step in which a metal having a low electric resistance is embedded in a groove and then smoothed so as to form an internal wire, and thus it is possible to achieve the effect that the increase in the resistance of the internal wire in the memory or the like, can be suppressed.

It should be noted that in the third embodiment, the interlayer insulating films can be formed by using a metal alkoxide such as TEOS.

Further, other examples of the metal having a low electric resistance used in the third embodiment, than copper, are tungsten (W), aluminum (Al), silver (Ag) and the like. With low electric resistance metals as those, the same effect as that of copper can be obtained.

In the third embodiment of the present invention, the film to be polished is made of metal. Therefore, as the etching solution, an acid solution such as a hydrogen peroxide solution and an iron nitirate solution can be used. The concentration of the acidic solution is controlled such that pH of the solution becomes about 2 to 5.

In the first to third embodiments of the present invention described so far, it is preferable that a polishing cloth of a type having a low compression rate and being not easily deformable, should be used. With use of such a polishing cloth, it becomes less likely to damage the protective film formed on the recess of the film to be polished, and the possibility that the depression is polished or etched is further reduced.

Throughout the first to third embodiments, silica particle, cerium oxide particle, alumina particle or the like can be used as the polishing particle of the polisher, and they should be appropriately selected in accordance with an etching solution employed. When silica particles are selected as the polishing powder, an average particle diameter of those should be about 200 to 500 Å, when cerium oxide particles are selected, it should be about 1000 Å, and when alumina particles are selected, it should be about 3,000 to 10,000 Å. Usually, the concentration of the polishing powder in the polisher should be about 0.5 to 10 weight %.

In the first to third embodiments, a solution containing a hydrophilic polysaccharide or the like, can be used as the protecting agent. Examples of the hydrophilic polysaccharide are hydroxyethyl cellulose or a cellulose derivative such as pullulan. Each of these compounds is used usually in condition being dissolved in water at a concentration of 0.1 to 10 volume %.

The protecting agent should be appropriately selected in accordance with the polishing particles employed. More specifically, it is preferable that the protecting agent should be of a type which does not cause an aggregation of the polishing particles when mixed with the etching solution and the particles. For example, when silica particles are used as the polishing particle and hydrophilic polysaccharide solution is used as the protecting agent, or when cerium oxide particles are used as the polishing particle and ammonium polycarboxylate solution is used as the protecting agent, the smoothing by the CMP method can be carried out properly without causing the aggregation of the polishing particles.

The descriptions of the first to third embodiments are made in connection with the case where the processing agent prepared by mixing the polisher and the etching solution, and the protecting agent are supplied on the polishing cloth from separate nozzles; however it is also possible that the etching solution, the polisher and the protecting agent are supplied from separate nozzles respectively. When these agents are supplied from the separate nozzles respectively, the mixing ratio and the flows of the etching solution, the polisher and the protecting agent can be easily adjusted.

Further, it is possible that the etching solution, the protecting agent and the polisher are mixed, and the resultant mixture is supplied onto the polishing cloth via one nozzle. In this case, the etching solution, the polisher and the protecting agent can be mixed together uniformly, and therefore the chemical-mechanical polishing can be performed at a high efficiency as compared to the case where these agents are supplied separately from the respective nozzles.

The total amount of the supply of the etching solution, the polisher and the protecting agent is controlled usually to be 100 to 400 mL/min. It should be noted that the etching solution, the polisher and the protecting agent can be mixed at various ratios. For example, when the depth of the "dishing" should be decreased, the ratio of the protecting agent should be increased. Or when the time required for the chemical-mechanical polishing should be shortened, the ratios of the etching solution and the polisher should be increased.

The above description is made in connection with the case where the projection of a film to be polished is polished or etched while supplying a protecting agent to the recess of the film to be polished; however it is also possible that a covering film is formed on the recess of the to-be-polished film in advance, and then the projection is polished and etched.

In the case where a covering film is formed in advance, the occurrence of the "dishing" can be suppressed even without supplying the protecting agent during the polishing and etching, since the recess portion of the film to be polished is covered by the covering film. However, it is still possible that the covering film may be damaged during the polishing and etching, and therefore the polishing and etching should preferably be performed while supplying the protecting agent even if the covering film is provided in advance.

In the case where the covering film is formed on the recess portion of the film to be polished, in advance, the covering film may be made of a resist material, SOG or the like, other than the materials discussed in the first to third embodiments for forming the protecting film, namely, hydrophilic polysaccharide. Further, as the protecting agent supplied during the polishing and etching, the above-listed hydrophilic polysaccharide can be used.

As described, with the chemical-mechanical polishing method, the polisher used in the chemical-mechanical polishing, and the method of manufacturing a semiconductor device by using the chemical-mechanical polishing method, all according to the present invention, a protective film is formed on a recess portion of a film to be polished, having an irregular surface (projection and recess), and therefore only a projection is selectively etched and polished without polishing the recess portion. Consequently, the "dishing" does not easily occur, and a smooth surface can be formed. With such a smooth surface, the shortcircuit between wires, and the increase in the electric resistance of internal wiring, can be suppressed. Thus, the production yield of the semiconductor device can be improved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

We claim:

1. A chemical-mechanical polishing method comprising the step of subjecting a film to be polished, provided on a main surface of a substrate, and having a projection portion and a recess portion on a surface thereof, to polishing and etching, wherein the projection portion of the film to be polished is mechanically polished and chemically etched while supplying a protecting agent on the film to be polished to cover the recess portion with a protective film, thereby protecting the recess portion from being chemically etched.

2. The method according to claim 1, wherein an insulating film is provided between said substrate and the film to be polished, and the film to be polished is made substantially of a semiconductor.

3. The method according to claim 1, wherein the film to be polished is made substantially of an insulating material.

4. The method according to claim 1, wherein an insulating film is provided between said substrate and the film to be polished, and the film to be polished is made substantially of a metal.

5. The method according to claim 1, wherein the protecting agent contains a hydrophilic polysaccharide.

6. The method according to claim 1, wherein the protecting agent contains hydroxyethyl cellulose.

7. The method according to claim 1, further comprising the step of covering the recess portion of the film to be processed, to protect the recess portion from being chemically etched, prior to the polishing and etching step.

8. The method according to claim 1, wherein the etching is carried out with use of a basic solution as an etching solution.

9. The method according to claim 1, wherein the etching is carried out with use of an acidic solution as an etching solution.

10. The method according to claim 1, wherein the polishing is carried out with use of a polishing particle selected from the group consisting of silica particle, alumina particle, cerium oxide particle and a mixture thereof.

11. A chemical-mechanical polishing method comprising the steps of:

subjecting a film to be polished, provided on a main surface of a substrate, and having a projection portion and a recess portion on a surface thereof, to covering of the recess portion with a covering film to protect it from being chemically etched; and mechanically polishing and chemically etching the projection portion of the film to be polished, the recess portion of which is covered by the covering film, wherein the covering film comprises at least one material selected from the group consisting of resist material, SOG, hydrophilic polysaccaride, and hydroxyethyl cellulose.

12. The method according to claim 11, wherein an insulating film is provided between said substrate and the film to be polished, and the film to be polished is made substantially of a semiconductor.

13. The method according to claim 11, wherein the film to be polished is made substantially of an insulating material.

14. The method according to claim 11, wherein an insulating film is provided between said substrate and the film to be polished, and the film to be polished is made substantially of a metal.

15. The method according to claim 11, wherein the polishing and etching step is carried out while supplying a protecting agent to the film to be polished, so as to cover the recess portion with a protecting film which protects the recess portion from being chemically etched.

16. The method according to claim 11, wherein the protecting agent contains a hydrophilic polysaccharide.

17. The method according to claim 11, wherein the protecting agent contains hydroxyethyl cellulose.

18. The method according to claim 11, wherein the etching is carried out with use of a basic solution as an etching solution.

19. The method according to claim 11, wherein the etching is carried out with use of an acidic solution as an etching solution.

20. The method according to claim 11, wherein the polishing is carried out with use of a polishing particle selected from a group consisting of silica particle, alumina particle, cerium oxide particle and a mixture thereof.

21. A polisher used for chemical-mechanical polishing comprising:

polishing particles for mechanically polishing a film to be polished, provided on a main surface of a substrate;

an etching solution for chemically etching the film to be polished; and a protecting agent for forming a protective film which covers the film to be polished, and protects a surface of the film to be polished, from the polishing and etching.

22. The polisher according to claim 21, wherein the protecting agent contains a hydrophilic polysaccharide.

23. The polisher according to claim 21, wherein the protecting agent contains hydroxyethyl cellulose.

24. The polisher according to claim 21, wherein the polishing particle is selected from a group consisting of silica particle, alumina particle, cerium oxide particle and a mixture thereof.

25. The polisher according to claim 21, wherein the etching solution is a basic solution.

26. The polisher according to claim 21, wherein the etching solution is an acidic solution.

27. A method of manufacturing a semiconductor device, comprising the steps of:

making a recess portion and a projection portion on one main surface of a substrate;

forming a film to be polished, having a recess portion and a projection portion on its surface, on the main surface of the substrate on which the recess portion and projection portion are made, the recess portion and the projection portion of the film to be polished, being situated to correspond to the recess portion and the projection portion of the main surface of said substrate, and a thickness of the film to be polished in the recess portion of said substrate being larger than a height of the projection portion of said substrate; and mechanically polishing and chemically etching the projection portion of the film to be polished while covering the recess portion of the film to be polished, to protect it with a protective film from being etched by supplying a protecting agent on the film to be polished.

28. The method according to claim 27, further comprising the step of forming an insulating film on the main surface of the substrate, between the steps of making the recess portion and the projection portion on the main surface of the substrate, and forming the film to be polished, wherein the film to be polished is made substantially of a semiconductor.

29. The method according to claim 27, wherein the film to be polished is made substantially of an insulator.

30. The method according to claim 27, wherein the step of making the recess portion and the projection portion on the main surface of the substrate, is carried out by forming an insulating layer on the main surface of the substrate such as to make a recess portion and a projection portion in a surface of the insulating layer, and the film to be polished is made substantially of a metal.

31. The method according to claim 27, wherein the protecting agent contains a hydrophilic polysaccharide.

32. The method according to claim 27, wherein the protecting agent contains hydroxyethyl cellulose.

33. The method according to claim 27, further comprising the step of covering the recess portion of the film to be processed, to protect the recess portion from being chemically etched, prior to the polishing and etching step.

34. The method according to claim 27, wherein the etching is carried out with use of a basic solution as an etching solution.

35. The method according to claim 27, wherein the etching is carried out with use of an acidic solution as an etching solution.

36. The method according to claim 27, wherein the polishing is carried out with use of a polishing particle selected from a group consisting of silica particle, alumina particle, cerium oxide particle and a mixture thereof.

37. A method of manufacturing a semiconductor device, comprising the steps of:

making a recess portion and a projection portion on one main surface of a substrate;

forming a film to be polished, having a recess portion and a projection portion on its surface, on the main surface of the substrate on which the recess portion and projection portion are made, the recess portion and the projection portion of the film to be polished, being situated to correspond to the recess portion and the projection portion of the main surface of said substrate, and a thickness of the film to be polished in the recess portion of said substrate being larger than a height of the projection portion of said substrate;

covering the recess portion of the film to be polished, with a covering film, from being chemically etched; and mechanically polishing and chemically etching the projection portion of the film to be polished, the recess portion of which is covered by the covering film.

38. The method according to claim 37, further comprising the step of forming an insulating film on the main surface of the substrate, between the steps of making the recess portion and the projection portion on the main surface of the substrate, and forming the film to be polished, wherein the film to be polished is made substantially of a semiconductor.

39. The method according to claim 37, wherein the film to be polished is made substantially of an insulator.

40. The method according to claim 37, wherein the step of making the recess portion and the projection portion on the main surface of the substrate, is carried out by forming an insulating layer on the main surface of the substrate such as to make a recess portion and a projection portion in a surface of the insulating layer, and the film to be polished is made substantially of a metal.

41. The method according to claim 37, wherein the polishing and etching step for removing the projection portion is carried out while supplying a protecting agent to the film to be polished, so as to cover the recess portion with a protecting film which protects the recess portion from being chemically etched.

42. The method according to claim 37, wherein the protecting agent contains a hydrophilic polysaccharide.

43. The method according to claim 37, wherein the protecting agent contains hydroxyethyl cellulose.

44. The method according to claim 37, wherein the etching is carried out with use of a basic solution as an etching solution.

45. The method according to claim 37, wherein the etching is carried out with use of an acidic solution as an etching solution.

46. The method according to claim 37, wherein the polishing is carried out with use of a polishing particle selected from a group consisting of silica particle, alumina particle, cerium oxide particle and a mixture thereof.

* * * * *

UNITED STATES PATENT AND TRADEMARK OFFICE
CERTIFICATE OF CORRECTION

PATENT NO.: 5,981,394
DATED: November 9, 1999
INVENTOR(S): Hiroyuki Ohashi et al.

It is certified that an error appears in the above-identified patent and that said Letters Patent is hereby corrected as shown below:

Claim 11, Column 13, line 13, "polysaccaride" should read - - polysaccharide - -.

Signed and Sealed this

Twenty-second Day of August, 2000

Attest:

Q. TODD DICKINSON

*Attesting Officer*   *Director of Patents and Trademarks*